United States Patent
Barkley

(10) Patent No.: US 7,791,944 B2
(45) Date of Patent: Sep. 7, 2010

(54) VOLTAGE REFERENCE GENERATOR FOR FLASH MEMORY

(75) Inventor: Gerald J. Barkley, Oregon, WI (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 12/165,342

(22) Filed: Jun. 30, 2008

(65) Prior Publication Data

US 2009/0323413 A1 Dec. 31, 2009

(51) Int. Cl.
*G11C 16/06* (2006.01)
(52) U.S. Cl. ............... 365/185.2; 365/185.23; 365/185.18; 365/185.03
(58) Field of Classification Search ............ 365/185.2, 365/185.23, 185.18, 185.03
See application file for complete search history.

(56) References Cited

U.S. PATENT DOCUMENTS 7,277,355 B2 * 10/2007 Tanzawa ............... 365/230.06
7,313,019 B2 * 12/2007 Giduturi et al. ........ 365/185.03
7,515,474 B2 * 4/2009 Giduturi ................ 365/185.23
2005/0068832 A1 * 3/2005 Andoh ..................... 365/222
2007/0183207 A1 * 8/2007 Park ..................... 365/185.22
2008/0285339 A1 * 11/2008 Barkley ................... 365/185.2

* cited by examiner

*Primary Examiner*—Connie C Yoha
(74) *Attorney, Agent, or Firm*—Schwegman, Lundberg & Woessner, P.A.

(57) ABSTRACT

There is disclosed example embodiments of flash memory including reference generators using big flash memory cells to generate flash array wordline voltages, wherein the reference voltage values can be trimmed by changing the threshold voltage of the flash cells. In addition, the inventive subject matter provides for using the matching characteristics of two source followers in closed loop and open loop to achieve fast stabilization times. Further, the temperature characteristics of the wordline voltages track the temperature characteristics of the array flash cells. Still further, the disclosed reference generators use cascoding reference generators to provide more reliability and accuracy.

8 Claims, 3 Drawing Sheets

US 7,791,944 B2

VOLTAGE REFERENCE GENERATOR FOR FLASH MEMORY

TECHNICAL FIELD

This invention relates generally to solid state memory devices, and more particularly to flash memory devices.

BACKGROUND

Flash memory stores information in an array of memory cells made from floating-gate transistors. In traditional single-level cell (SLC) flash memory devices, each cell stores only one bit of information. Multi-level cell (MLC) flash memory devices can store more than one bit per cell by choosing between multiple levels of electrical charge to apply to the floating gates of its cells. The flash cell is programmed by applying a voltage to a gate of a cell using a wordline that is coupled to the gate. Voltage reference generators are used to produce the applied voltage.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Figure 1:
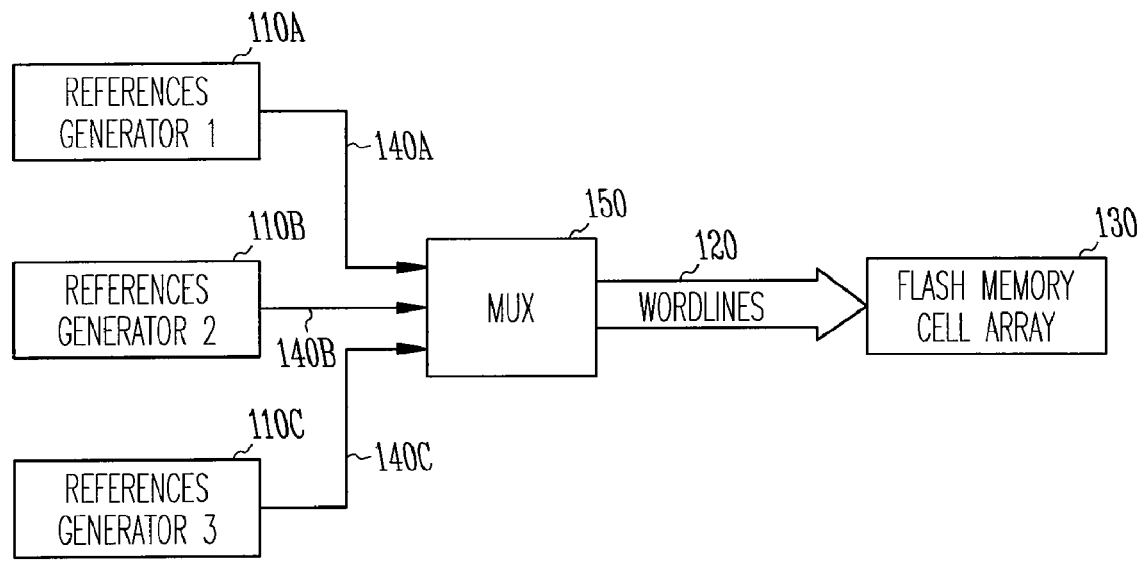
FIG. 1 illustrates a flash memory device, according to one example embodiment of the inventive subject matter.
Figure 2:
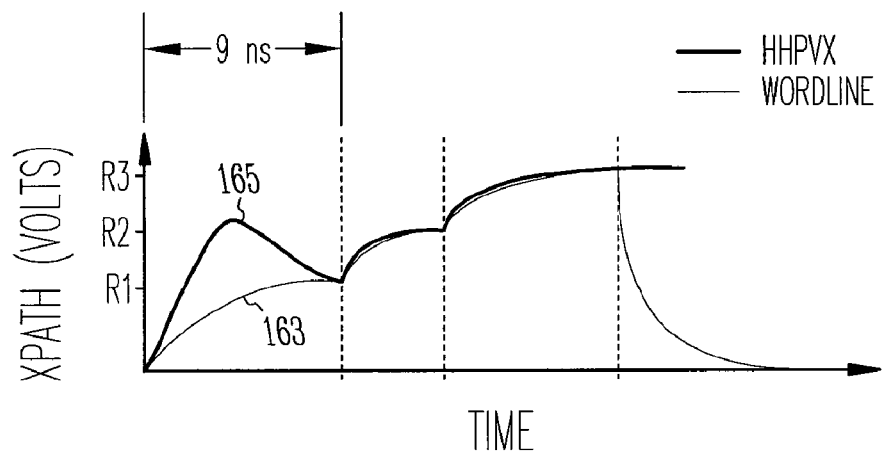
FIG. 2 illustrates a wordline drive waveform, according to one example embodiment of the inventive subject matter.

According to one example embodiment 100 of the inventive subject matter illustrated in FIG. 1, there is provided a voltage reference generator 110 to drive the wordlines ("WL") 120 of an array of flash memory cells 130 in multi-level cells ("MLC"). According to one example mode of operation, three such voltage generators 110a, 110b and 110c, may be used to produce three reference voltages 140a, 140b and 140c, and these reference voltages may be switched onto the WL 120 through a multiplexor ("MUX") 150 to produce a step waveform 165, as illustrated in FIG. 2, wherein waveform 163 corresponds to the voltage HHVPX in FIG. 3.

In one example embodiment, the ordered switching may determine the output loop and output stage topology of the reference generator 110.

Figure 3:
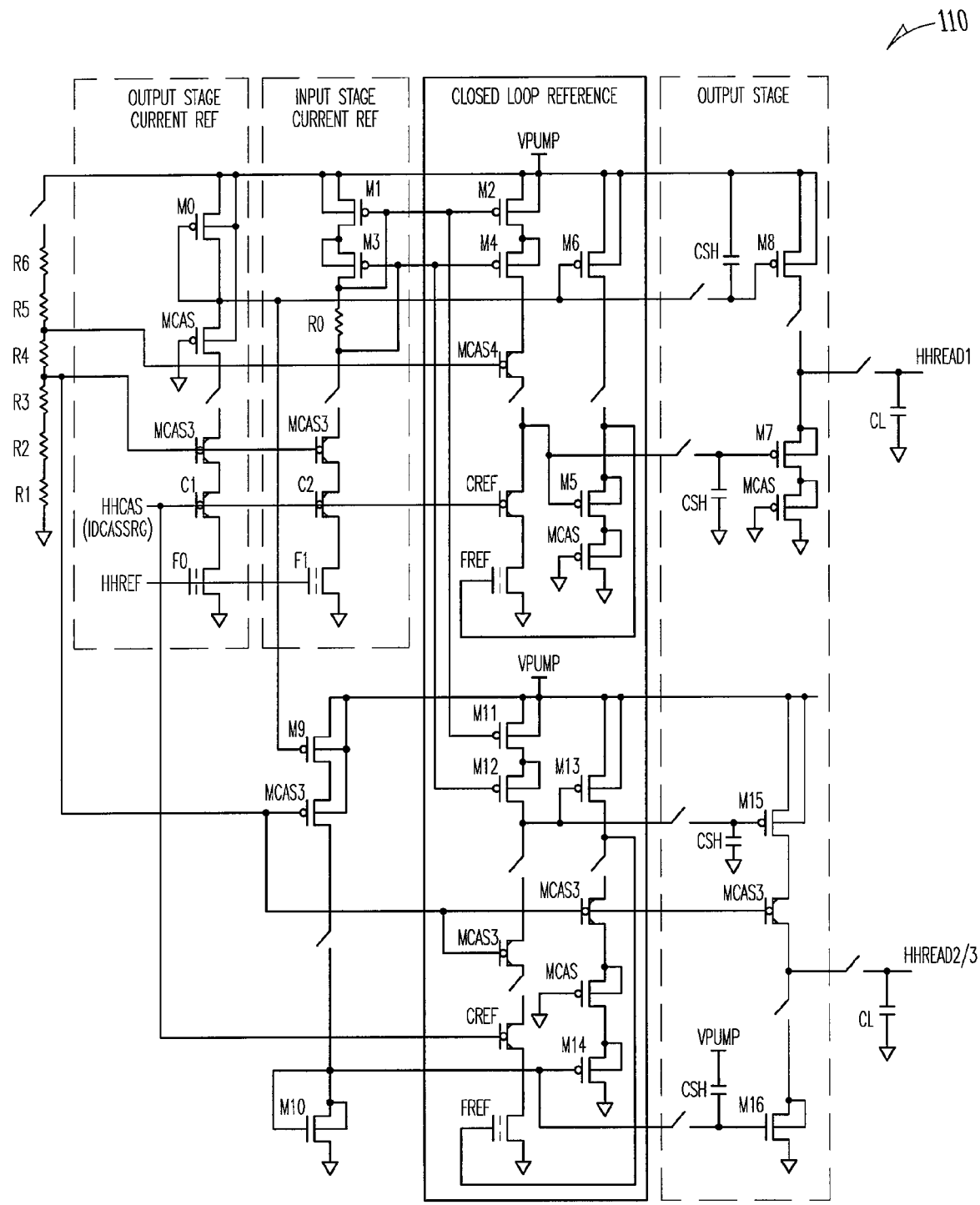
FIG. 3 illustrates an example embodiment of a reference generator, according to the inventive subject matter.

One example embodiment of a reference generator 110 is illustrated in FIG. 3, the high-precision reference generator 110 includes reference current generators, reference voltage generators, and output drivers. According to one example embodiment, the individual reference voltages are generated using Big Flash Cell ("BFC") based circuits as shown by the block marked as F0, F1 and Fref. Fref is the BFC cell with a threshold voltage $V_T$. The transistors M2, M4, M11 and M12 are part of a high-swing current mirror that reflects a current of magnitude equal to the $V_t$ current of the flash cell. The $V_t$ current is defined as the drain current of a BFC1 when its gate voltage is set equal to its threshold voltage $V_t$. C1, C2 and Cref are cascode transistors used to regulate the drain voltage of the BFC. Components M5 and M6 form a PMOS source follower, with M5 as the source follower transistor and M6 as the current source. The BFC limb and the source follower together form a closed loop. The output voltage of the closed loop at node internal feedback is equal to the threshold voltage of the BFC cell $V_T$. However, this node is not directly used to drive the WL voltage path as the closed loop will be very slow to respond (typically 100's of nanoseconds ("nS") compared to the reference speed requirement of less than 10 nS. This is resolved by adding a matching second source-follower M7, M8, outside the closed loop. The gate of M8 is the same as that of M6, and the gate of M7 is the same as that of M5. As the second source follower is in open loop, it can respond very fast, and the reference generator requirement of less than 10 nS stabilization time is achievable. Due to the tight matching between the two current mirrors the output voltage at HHREAD1 will be the same as that at INTRERNAL FEEDBACK. The PMOS source follower described above is very good at discharging the node HHREAD1 from a voltage higher than $V_T$ to a value equal to $V_T$, so this reference generator configuration should be used where the reference voltage output on WL needs to be brought down from a higher value (e.g. reference-down WL waveform shown in FIG. 2) to the new value. According to another example embodiment, for pull-up applications, the PMOS current mirror may be replaced with a NMOS current mirror, where M13 acts as the current source and M14 acts as the source follower transistor, as shown in FIG. 3.

The high-precision reference generator 110, according to the inventive subject matter, requires two reference current generators, one for the BFC limbs and the second for the source-follower stages. Both reference current generators can make use of the same scheme. In the present example embodiment, the reference current is generated using BFC cells and their gates are driven using a on-chip reference voltage. The $V_t$ of the BFC cells may be set to the same value as the reference voltage magnitude. In FIG. 3, F0 and F1 driven by HHREF provides the reference current for the BFC limbs of the high-precision reference generator and the reference current for the source followers.

The devices M1, M3 and R0 form a high-swing cascode current mirror for the BFC limbs. This example configuration requires less voltage head room, $V_t+2 \Delta V$, compared to $2 V_t+2 \Delta V$ for a conventional cascoded current mirror and provides a more precise current mirror and voltage reference. Devices M9 and M10 form a conventional cascode current mirror and this is used for the source followers as there are no head room issues.

The resistor chain, R1 through R6, is used to generate cascode gate voltages that prevent systematic offset within the system and improve reliability and precision by reducing impact ionization. The cascode devices MCAS3, MCAS4, and MCAS are used to generate a high impedance to the drain of the transistors that mirror the current. The overall effect is to make the drain to source voltage across the transistors that set the current less than 4 volts. This is a desired voltage to limit impact ionization and improve systematic offset across temperature.

The reference voltages from the three reference generators 110 along with the supply voltage VPUMP are fed into a 4:1 MUX. The switching pattern of switches, a pull-down and pull-up, generates the step waveform. The output of the MUX drives the WL path of the flash array.

In addition, according to another example embodiment, in order to save active power sample-and-hold ("S/H"), features may be implemented on some of the critical nodes. In this embodiment, the reference-generator 100 will still function as expected in hold mode. The Csh nodes are the most critical node that can be sampled and held as shown in FIG. 3. Once in hold mode, the BFC limb and source follower inside the feedback loops can be turned off. The capacitors Csh nodes maintain the gate voltage for M7 and M8, and the reference generator 110 output response remains unchanged. The Csh nodes need to be refreshed at a frequency depending on the leakage tolerance of that node.

Thus, according to the inventive subject matter described herein, there is provided example embodiments of reference generators using big flash memory cells to generate flash array wordline voltages, wherein the reference voltage values can be trimmed by changing the threshold voltage of the flash cells. In addition, the inventive subject matter provides for using the matching characteristics of two source followers in closed loop and open loop to achieve fast stabilization times. Further, the temperature characteristics of the WL voltages track the temperature characteristics of the array flash cells. Still further, the disclosed reference generators use cascading reference generators to provide more reliability and accuracy.

According to one example embodiment, the reference voltage characteristics track the array cell characteristics. The reference-gate $V_t$ sensing scheme built using the reference scheme described above may also assist with the MLC window budget. According to another example embodiment, the reference voltage generators of the inventive subject matter described herein provide a fundamental block of a sensing scheme wherein the wordline voltages of selected array flash cells are referenced through different levels. Further, the cascoded configuration of the reference generator described herein resists systematic offset and may be more reliable because the configuration may reduce impact ionization which will degrade the performance over time.

Figure 4:
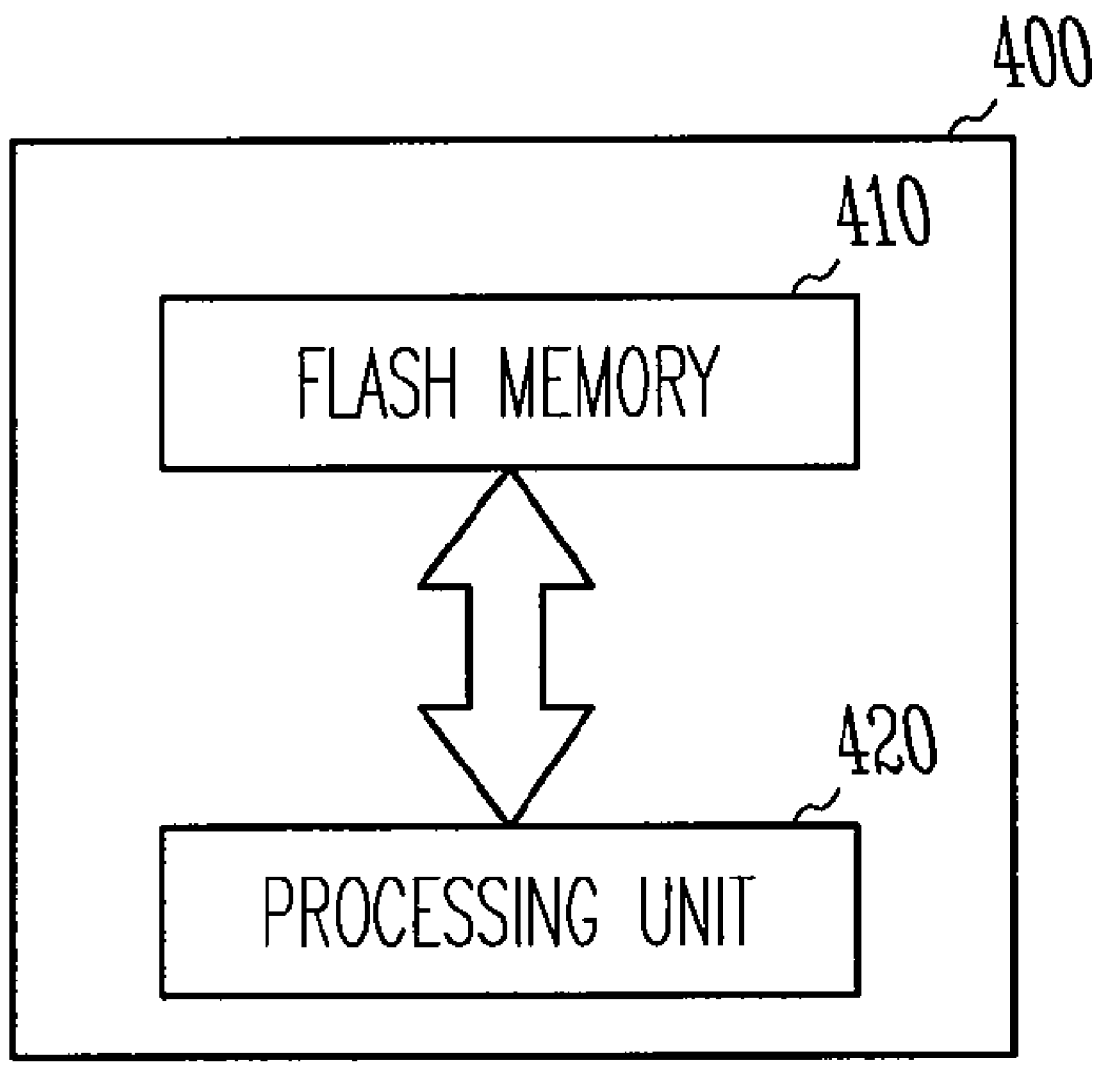
FIG. 4 illustrates an electronic device including a flash memory device of the type illustrated in FIG. 1, according to one example embodiment.

Referring now to FIG. 4, there is illustrated an electronic system or device 400 that uses a flash memory 410 incorporating the reference generator 110 and applications thereof described in FIGS. 1, 2, and 3. According to one embodiment, system or device 400 includes a processing unit 420 that executes instructions or retrieves and stores data or instructions in memory 410. System or device 400 may be, for example, a programmable microprocessor-based system such as a personal computer or any other programmable device including portable or hand held devices such as notebook computers, personal digital assistants, mobile telephone systems, or the like.

The invention claimed is:

1. An apparatus comprising:
an array of flash memory cells;
at least one reference voltage generator formed at least in part using big flash memory cells to generate flash array wordline voltages; and
wherein the generator uses the matching characteristics of two source followers in closed loop and open loop to achieve fast stabilization times.

2. The apparatus according to claim 1 wherein the reference voltage is trimmed by changing the threshold voltage of the flash cells.

3. The apparatus according to claim 1 further wherein the generator provides that the temperature characteristics of the worldline voltages track the temperature characteristics of the array of flash memory cells.

4. The apparatus according to claim 1 further including cascoding more than one of the generators to provide reliability and accuracy.

5. An apparatus comprising a reference voltage generator formed at least in part using big flash memory cells to generate flash array wordline voltages, wherein the generator uses the matching characteristics of two source followers in closed loop and open loop to achieve fast stabilization times.

6. The apparatus according to claim 5 wherein the reference voltage is trimmed by changing the threshold voltage of the flash cells.

7. The apparatus according to claim 5 further wherein the generator provides that the temperature characteristics of the worldline voltages track the temperature characteristics of an array of flash memory cells.

8. The apparatus according to claim 5 further including cascoding more than one of the generators to provide reliability and accuracy.

* * * * *